United States Patent
Dennison et al.

(10) Patent No.: US 8,030,734 B2
(45) Date of Patent: Oct. 4, 2011

(54) FORMING PHASE CHANGE MEMORIES WITH A BREAKDOWN LAYER SANDWICHED BY PHASE CHANGE MEMORY MATERIAL

(75) Inventors: Charles H. Dennison, San Jose, CA (US); George A. Gordon, San Jose, CA (US); John Peters, San Jose, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 327 days.

(21) Appl. No.: 12/346,507

(22) Filed: Dec. 30, 2008

(65) Prior Publication Data

US 2010/0163825 A1    Jul. 1, 2010

(51) Int. Cl.
*H01L 21/82* (2006.01)
*H01L 21/20* (2006.01)
*H01L 29/00* (2006.01)

(52) U.S. Cl. .......... 257/529; 438/131; 438/385; 257/30; 257/E21.592

(58) Field of Classification Search .................. 438/131, 438/385; 257/30, 529, E21.592
See application file for complete search history.

(56) References Cited

U.S. PATENT DOCUMENTS

| | | | |
|---|---|---|---|
| 4,845,533 A | 7/1989 | Pryor et al. | 357/2 |
| 5,177,567 A | 1/1993 | Klersy et al. | 257/4 |
| 6,153,890 A | 11/2000 | Wolstenholme et al. | 257/3 |
| 2004/0183107 A1 | 9/2004 | Horii et al. | 257/257 |
| 2005/0029627 A1 | 2/2005 | Dennison | 257/618 |
| 2006/0073655 A1 | 4/2006 | Dennison | 438/227 |
| 2007/0200202 A1* | 8/2007 | Nowak et al. | 257/613 |
| 2009/0065760 A1* | 3/2009 | Lee et al. | 257/4 |
| 2010/0091561 A1* | 4/2010 | Lowrey et al. | 365/163 |
| 2010/0096610 A1* | 4/2010 | Wang et al. | 257/2 |
| 2010/0163822 A1* | 7/2010 | Ovshinsky et al. | 257/2 |
| 2010/0233849 A1* | 9/2010 | Lee et al. | 438/104 |
| 2010/0276788 A1* | 11/2010 | Jain | 257/629 |
| 2010/0302836 A1* | 12/2010 | Herner et al. | 365/148 |
| 2010/0328989 A1* | 12/2010 | Yamazaki | 365/151 |

* cited by examiner

*Primary Examiner* — Ngan Ngo

(74) *Attorney, Agent, or Firm* — Lisa K. Jorgenson; Hayley J. Stevens; Seed IP Law Group PLLC

(57) ABSTRACT

A phase change memory cell may be formed with a pair of chalcogenide phase change layers that are separated by a breakdown layer. The breakdown layer may be broken down prior to use of the memory so that a conductive breakdown point is defined within the breakdown layer. In some cases, the breakdown point may be well isolated from the surrounding atmosphere, reducing heat losses and decreasing current consumption. In addition, in some cases, the breakdown point may be well isolated from overlying and underlying electrodes, reducing issues related to contamination. The breakdown point may be placed between a pair of chalcogenide layers with the electrodes outbound of the two chalcogenide layers.

20 Claims, 5 Drawing Sheets

FORMING PHASE CHANGE MEMORIES WITH A BREAKDOWN LAYER SANDWICHED BY PHASE CHANGE MEMORY MATERIAL

BACKGROUND

1. Technical Field

The present disclosure relates generally to phase change memories.

2. Description of the Related Art

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

BRIEF SUMMARY

The present disclosure is directed to a method of forming a phase change memory cell. The method includes forming a first phase change layer, forming a breakdown layer, and forming a second phase change layer, the first and second phase change layers separated by the breakdown layer.

DETAILED DESCRIPTION

Figure 1:
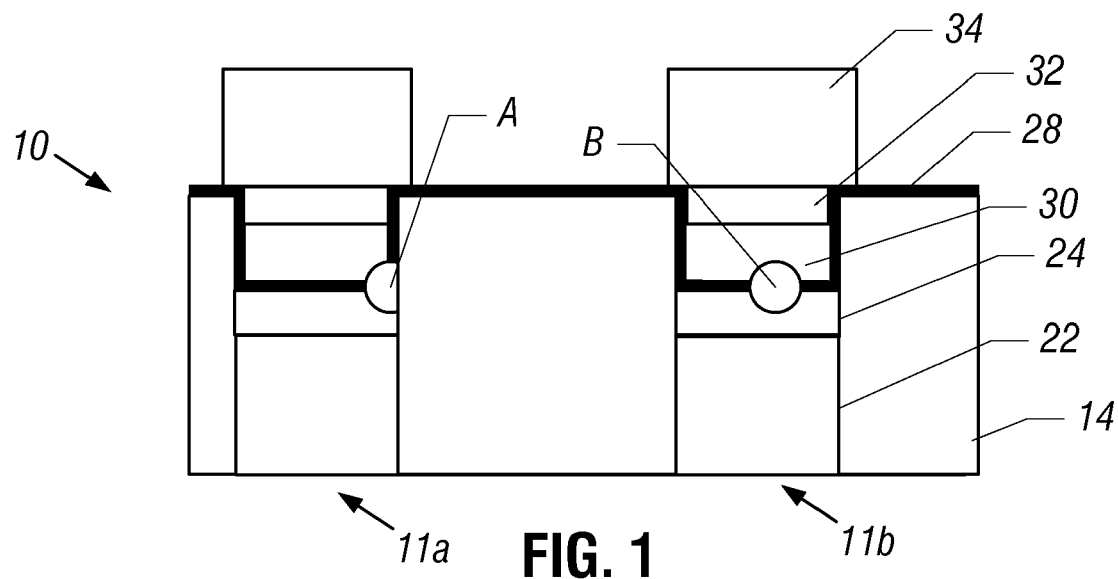
FIG. 1 is a partial, cross-sectional view of one embodiment of the present disclosure.

Referring to FIG. 1, a phase change memory 10 may be formed over a substrate and may include a row metal (not shown) and other components, including an ovonic threshold switch. While two memory cells 11a and 11b are depicted, many more cells may be included, for example, arranged in rows and columns.

A pore may be formed in the insulator 14 and within the pore may be formed a heater 22 as shown in FIG. 1. The heater 22 conducts current between the column metal 34 and the row metal (not shown) and generates heat as a result of Joule heating. The heater 22 may be formed of titanium silicon nitride, as one example, but any suitable material may be used for the heater 22.

In one embodiment, the insulator 14 may include high density plasma (HDP) oxide fill. In another embodiment, the insulator 14 may be plasma enhanced chemical vapor deposition nitride, together with high density plasma oxide fill.

A first chalcogenide layer 24 may be formed within the pore over the heater 22. In one embodiment, the chalcogenide layer may be $Ge_2Sb_2Te_5$ (GST 225). Overlaying the first chalcogenide layer 24 and the insulator 14 may be a breakdown layer 28. The breakdown layer 28 may be silicon nitride, silicon dioxide, aluminum oxide, or tantalum oxide, to mention a few examples. The breakdown layer 28 thickness may be less than 50 Angstroms in some embodiments. The breakdown layer 28 may be formed by chemical vapor deposition, metal organic chemical vapor deposition, or atomic layer deposition, to mention a few examples. A breakdown layer is a dielectric or insulating layer formed of a material at a thickness that exhibits dielectric breakdown when exposed to an electric field of less than 10 volts.

Another chalcogenide layer 30 may be formed in the pore over the breakdown layer 28. This chalcogenide layer 30 may also be GST 225 in one embodiment. A top electrode 32 may be formed in the pore after forming the additional chalcogenide layer 30. A column metal 34 may be coupled to the top electrode 32.

When current passes between the column metal 34 and the row metal below (not shown in FIG. 1), current is conducted through the two chalcogenide layers 24 and 30, resulting in a dielectric breakdown, indicated at A or B, in the breakdown layer 28. The breakdown may occur as a result of the passage of current, generating sufficient heat to cause the dielectric to fail. A conductive filament (not shown) forms at the point where the dielectric breakdown layer 28 fails. The filament forms a permanent conductive path through the otherwise insulative breakdown layer 28. Thereafter, the resistance of the breakdown layer 28 is dramatically reduced by the short formed through the layer 28. Thus, in breakdown or dielectric breakdown, an insulator acts as an electrical conductor.

The dielectric breakdown may occur at a variety of places across the width of the breakdown layer 28 within the pore. If the failure occurs at point A, for example, it is along an edge of the pore, but if the failure occurs at point B, it can be considered centrally located within the pore.

Regardless of where the breakdown occurs, it is the point where the chalcogenide layers 24 and 30 are exposed to the highest current. At this point, the chalcogenide layers 24 and 30 are most likely to change phase between amorphous and crystalline phases, where they are well isolated from any outside influences. Thus, not only is that point insulated thermally, it is effectively isolated from the top electrode 32 and the row metal therebelow. The breakdown point is also isolated from the heater 22.

As a result, sources of contamination are relatively distant from the breakdown point and the thermal isolation achieved is advantageous at those locations. In some embodiments, programming currents may be reduced due to improve thermal insulation between the breakdown point and the external environment. The region where the phase change occurs is spaced well away from any electrode interface to reduce migration, diffusion, or interaction of electrode material and phase change material that may affect cycle endurance.

Figure 2:
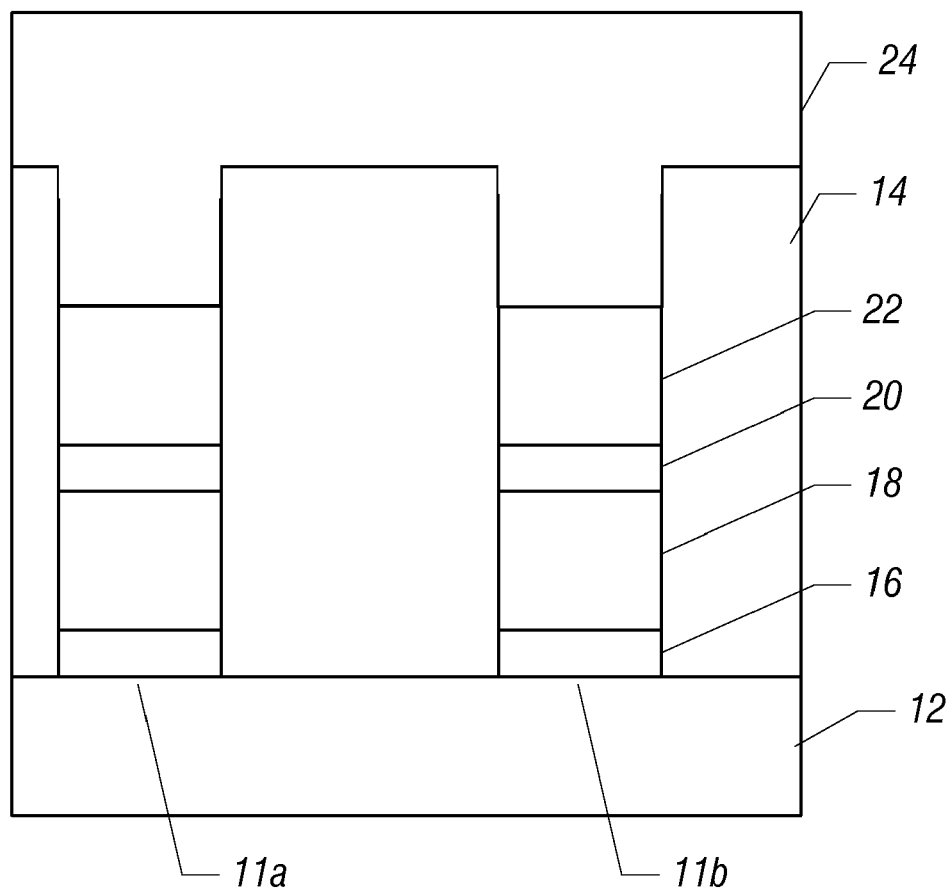
FIG. 2 is a partial, cross-sectional view of the embodiment shown in FIG. 1 at an early stage of fabrication.

In one embodiment, the structure shown in FIG. 1 may be fabricated as explained hereinafter. However, other fabrication techniques may also be used. Starting in FIG. 2, the row metal 12 may be covered by an insulator layer 14 in which pores are formed to define the individual phase change memory cells 11a or 11b. Each cell 11a or 11b may include a bottom electrode 16 that may be formed of any suitable conductor.

Over the bottom electrode 16 may be formed a chalcogenide layer 18 that generally does not change phase in normal operation of the memory and is normally in the amorphous phase. Therefore, the layer 18 is not used to store information in some embodiments. The chalcogenide layer 18 may, in other embodiments, be utilized to form an ovonic threshold switch or other selection device.

In one embodiment, an intermediate electrode 20 may be formed over the chalcogenide layer 18, which is intermediate between the ovonic threshold switch and an overlying phase change memory element that actually changes phase and stores information. More particularly, a heater 22 may be placed over the layer 20. In one embodiment, the heater 22 may be formed of titanium silicon nitride.

In some cases, the layers 22, 20, 18, and 16 may be blanket deposited, patterned, and etched. Thereafter, the resulting etched openings may be filled with the insulator 14. Then, a chalcogenide layer 24 may be deposited so as to extend into the pore, defining each cell in the insulator 14. In one embodiment, the phase change layer 24 may be GST 225. The phase change layer 24 may be deposited by physical vapor deposition, chemical vapor deposition, metal organic chemical vapor deposition, plasma metal organic chemical vapor deposition, or atomic layer deposition, to mention a few examples.

Figure 3:
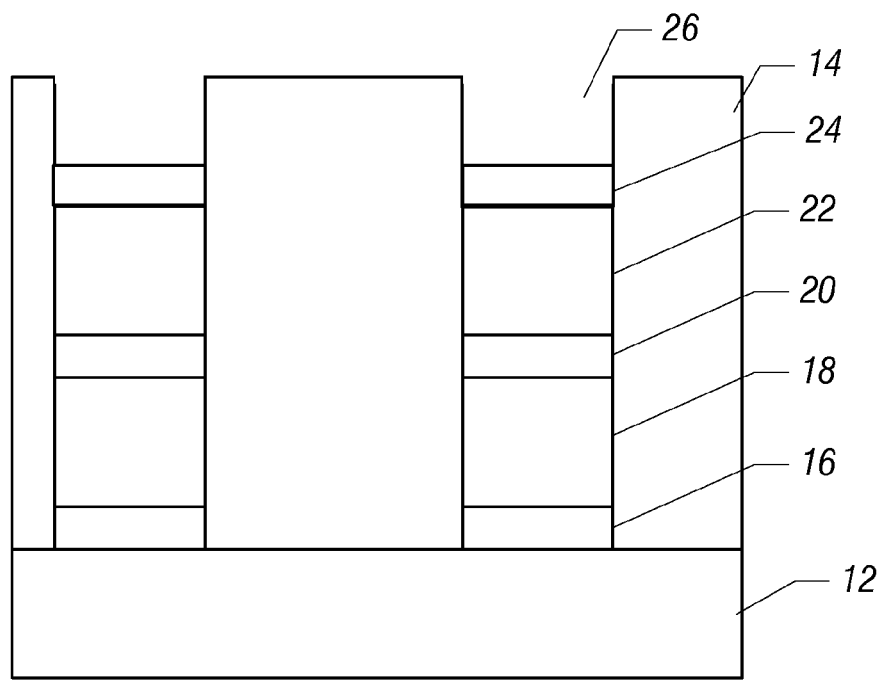
FIG. 3 is a partial, cross-sectional view of the embodiment shown in FIG. 2 at a subsequent stage of manufacture.

Moving to FIG. 3, thereafter, the chalcogenide layer 24 may be chemically mechanically planarized or etched back to form an opening 26, while leaving a portion of the chalcogenide 24 within the pore of each cell. A recess etch may be done as a dip back, for example. In another embodiment, the recess etch may be done as a wet dipback, using a 20% nitric acid solution. In some embodiments, the recess etch may be done using a plasma etch, such as an $O_2$ plasma etch.

Figure 4:
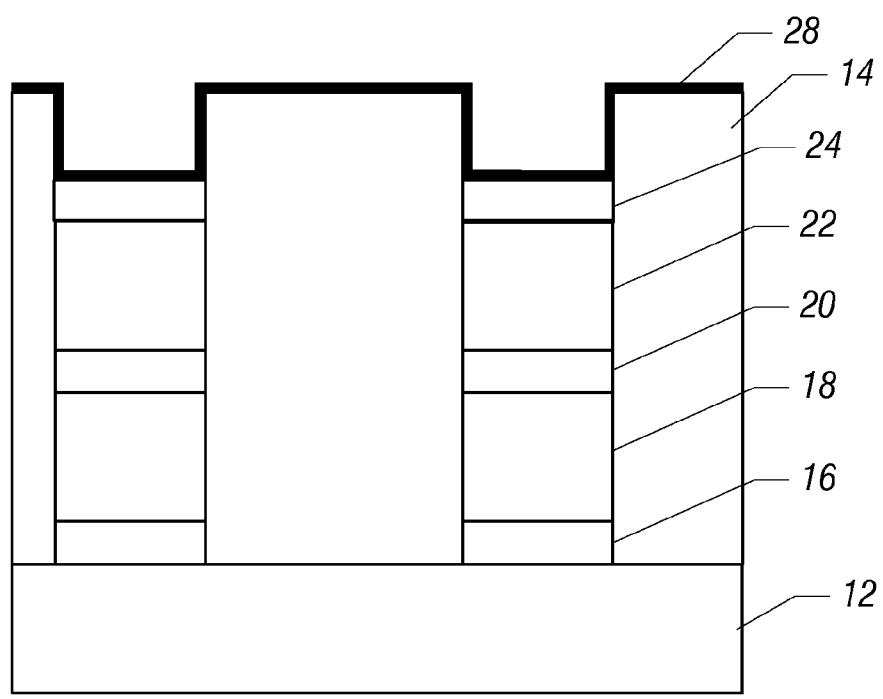
FIG. 4 is a partial, cross-sectional view of the embodiment shown in FIG. 3 at a subsequent stage of manufacture.

Next, referring to FIG. 4, the breakdown layer 28 may be blanket deposited in one embodiment. Prior to blanket deposition, a clean post-etch back may be done using, for example, argon sputter etch, $NF_3$ clean, or $H_2$ clean. The clean may be done in the same tool that subsequently does the breakdown layer 28 deposition. The breakdown layer 28 may be deposited directly on the remaining chalcogenide layer 24. However, in other embodiments a sidewall spacer may be placed within the pore that is then overlaid by the breakdown layer 28.

Figure 5:
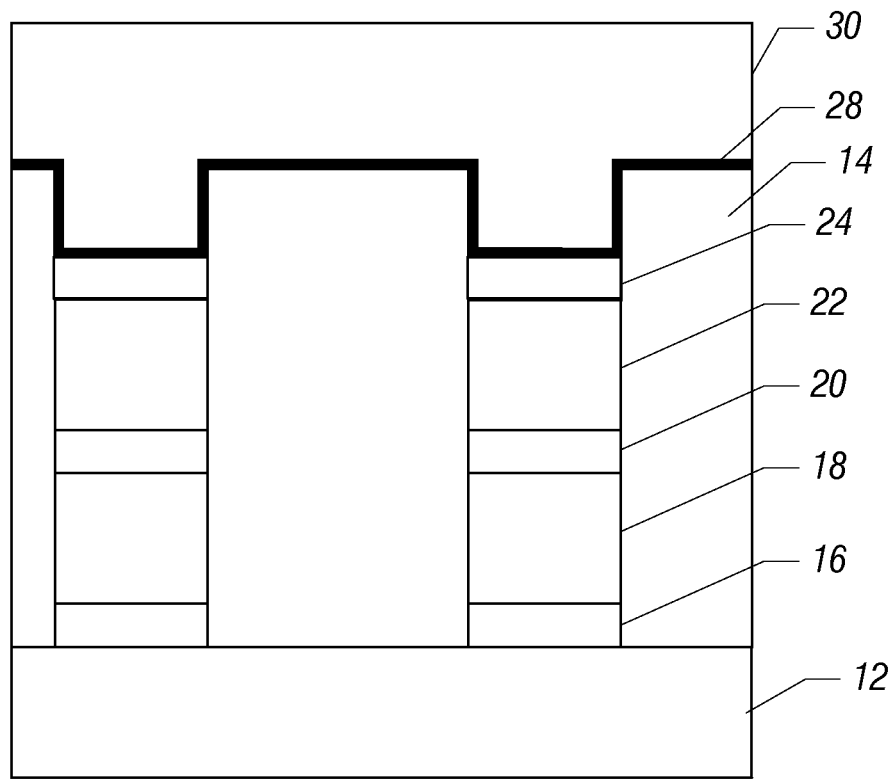
FIG. 5 is a partial, cross-sectional view of the embodiment shown in FIG. 4 at a subsequent stage of manufacture.

As shown in FIG. 5, the chalcogenide layer 30 may be deposited. The second chalcogenide layer 30 may be GST 225 or another chalcogenide material.

Figure 6:
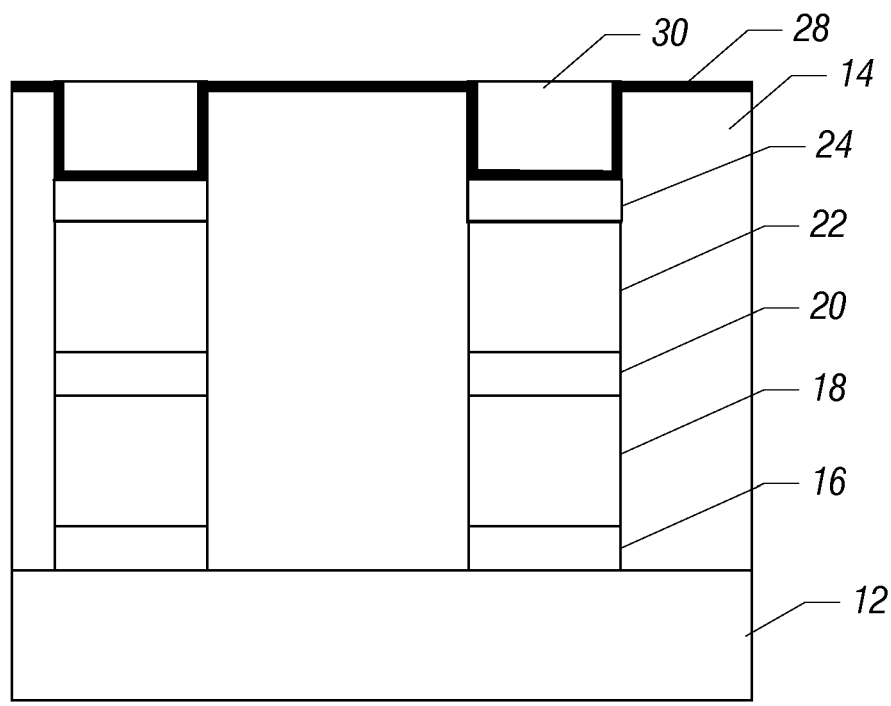
FIG. 6 is a partial, cross-sectional view of the embodiment shown in FIG. 5 at a subsequent stage of manufacture.
Figure 7:
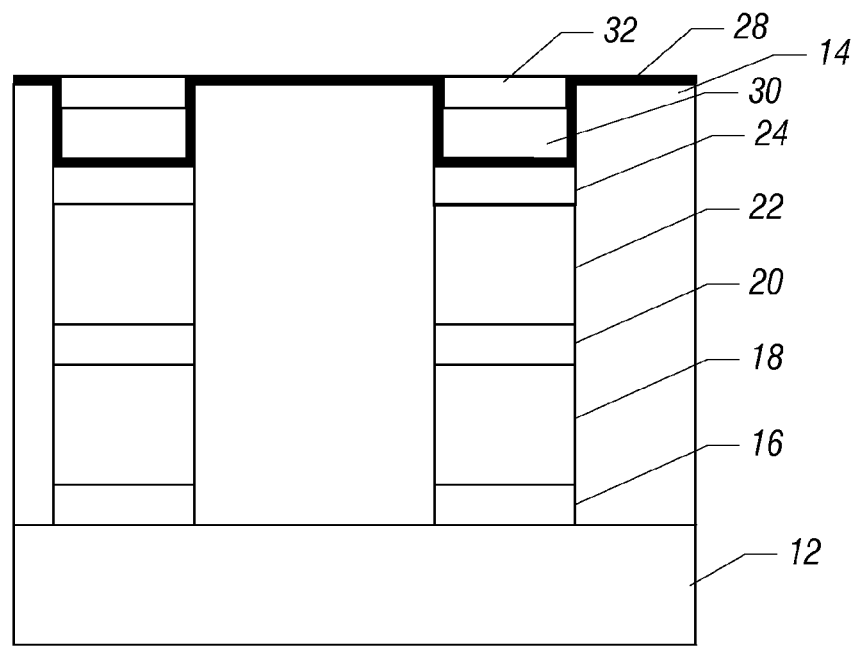
FIG. 7 is a partial, cross-sectional view of the embodiment shown in FIG. 6 at a subsequent stage of manufacture.

After planarizing the chalcogenide layer 30 as shown in FIG. 6, a recess etch may be done of the chalcogenide layer 30, followed by deposition of a top electrode 32 (FIG. 7) in the recess. The top electrode 32 may be formed of any electrically conductive material and may be the same material or a different material as the bottom electrode 16.

Figure 8:
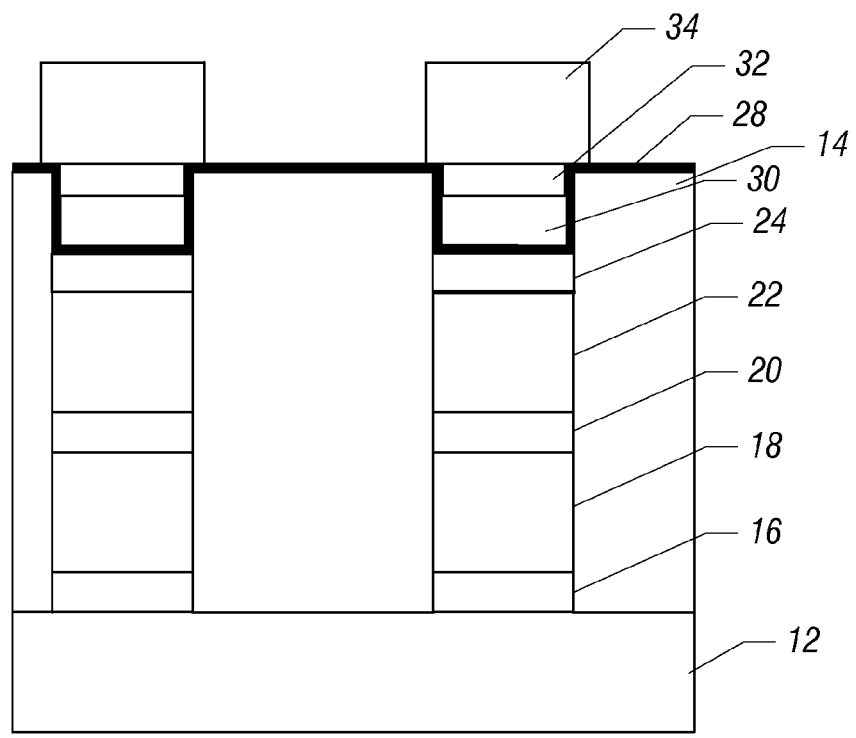
FIG. 8 is a partial, cross-sectional view of the embodiment shown in FIG. 7 at a subsequent stage of manufacture.

Then, as shown in FIG. 8, the column metal 34 may be deposited and patterned. The column metal formation may, for example, be a subtractive metal process, such as metal deposition, lithography and etch, or a damascene metallization. With a damascene metallization, a combination insulating etch stop diffusion barrier can be deposited prior to silicon dioxide deposition in one embodiment.

Figure 9:
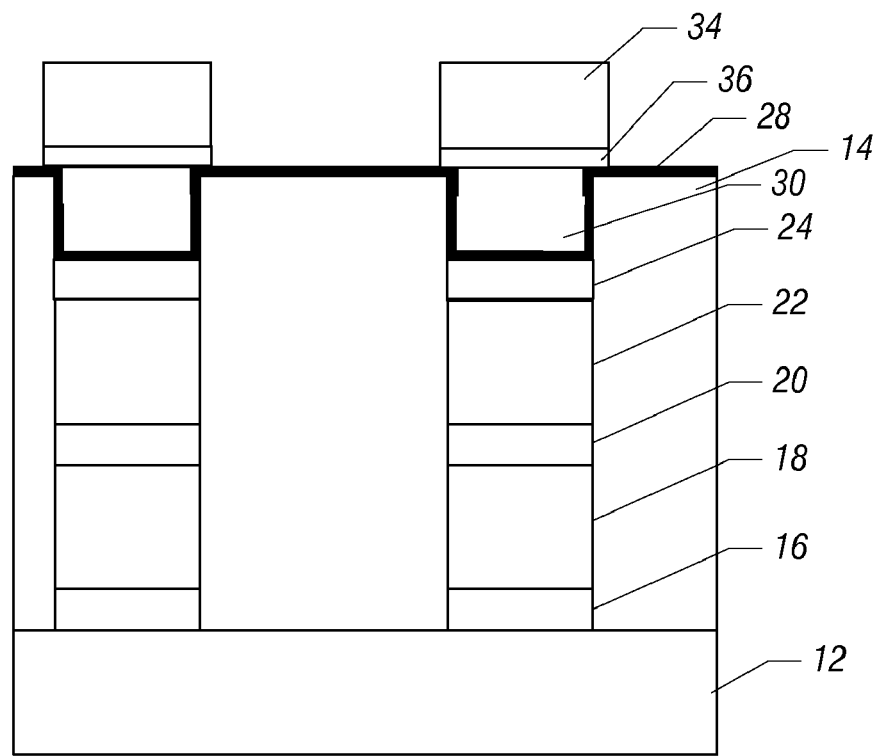
FIG. 9 is a partial, cross-sectional view of another embodiment at a subsequent stage to that shown in FIG. 6.

Referring next to FIG. 9, in accordance with another embodiment of the present disclosure, following the sequence shown in FIGS. 2-6, a barrier layer 36 may separate the column metal 34 from the chalcogenide layer 30. This enables the formation of the column metal without recessing the chalcogenide layer 30 and enables forming a self-aligned top electrode. The barrier layer 36 may be titanium nitride, titanium aluminum nitride, tantalum nitride, carbon, or other electrically conductive layer that does not chemically react in adverse ways with the phase change layer 30.

Generally, the breakdown layer 28 is broken down prior to distribution of the product to customers. This breakdown may be done using a sufficient voltage level that exceeds the breakdown voltage of the breakdown layer 28. However, it is desirable that the layer 28 breaks down at voltage differences of less than 10 volts.

Programming of the chalcogenide layers 24 and 30 to alter the state or phase of the material may be accomplished by applying voltage potentials to the lower electrode 16 and column metal 34, thereby generating a voltage potential across the select device and memory element. When the voltage potential is greater than the threshold voltages of the select device and memory element, then an electrical current may flow through the chalcogenide layers 24 and 30 in response to the applied voltage potentials, and may result in heating of the chalcogenide layers 24 and 30.

This heating may alter the memory state or phase of the chalcogenide layers 24 and 30, especially the areas of chalcogenide close to the filament through the breakdown layer 28. Altering the phase or state of the chalcogenide layers 24 and 30 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state, and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a higher relative temperature to amorphosize and "reset" the memory material (e.g., program memory material to a logic "0" value). Heating the volume of memory material to a lower relative crystallization temperature may crystallize and "set" the memory material (e.g., program memory material to a logic "1" value). Various resistances of memory material may be achieved to store information by varying the amount of current flow and duration through the volume of memory material.

A select device may operate as a switch that is either "off" or "on" depending on the amount of voltage potential applied across the memory cell. More particularly, the device is triggered into the "on" state when the current through the select device exceeds its threshold current or voltage. The "off" state may be a substantially electrically nonconductive state and the "on" state may be a substantially conductive state, with less resistance than the "off" state.

In the "on" state, the voltage across the select device, in one embodiment, is equal to its holding voltage $V_H$ plus IxRon, where Ron is the dynamic resistance from the extrapolated X-axis intercept, $V_H$. For example, a select device may have a threshold voltage and, if a voltage potential less than the threshold voltage of the select device is applied across the select device, then the select device may remain "off" or in a relatively high resistive state. While in the "off" state, little or no electrical current passes through the memory cell and most of the voltage drop from selected row to selected column is across the select device. Alternatively, if a voltage potential greater than the threshold voltage of the select device is applied across the select device, the select device may turn "on". The "on" state is a relatively low resistive state where electrical current passes through the memory cell. In other words, one or more series-connected select devices may be in a substantially electrically nonconductive state if less than a predetermined voltage potential, e.g., the threshold voltage, is applied across the select devices. Additionally, the select devices may be in a substantially conductive state if greater than the predetermined voltage potential is applied across the select devices. The select device may also be referred to as an access device, an isolation device, or a switch.

In one embodiment, each select device may comprise a switch material 18 such as a chalcogenide alloy, and may be referred to as an ovonic threshold switch or simply an ovonic switch. The switch material 18 of the select devices may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device may be a two-terminal device that may have a current-voltage (I-V) characteristic similar to a phase change memory element that is in the amorphous state. However, unlike a phase change memory element, the switching material of the select devices may not change phase. That is, the switching material of the select devices may not be a programmable material, and, as a result, the select devices may not be a memory device capable of storing information. For example, the switching material of the select devices may remain permanently amorphous and the I-V characteristic may remain the same throughout the operating life.

In the low voltage or low electric field mode, i.e., where the voltage applied across a select device is less than a threshold voltage (labeled $V_{TH}$), the select device may be "off" or nonconducting, and exhibit a relatively high resistance, e.g., greater than about 10 megaOhms. The select device may remain in the "off" state until a sufficient voltage, e.g., $V_{TH}$, is applied, or a sufficient current is applied, e.g., $I_{TH}$, that may switch the select device to a conductive, relatively low resistance "on" state. After a voltage potential of greater than about $V_{TH}$ is applied across the select device, the voltage potential across the select device may drop ("snapback") to a holding voltage potential, $V_H$. Snapback may refer to the voltage difference between $V_{TH}$ and $V_H$ of the select device.

In the "on" state, the voltage potential across a select device may remain close to the holding voltage of $V_H$ as current passing through the select device is increased. The select device may remain on until the current through the select device drops below a holding current, $I_H$. Below this value, the select device may turn off and return to a relatively high resistance, nonconductive "off" state until the $V_{TH}$ and $I_{TH}$ are exceeded again.

In some embodiments, only one select device may be used. However, in other embodiments, more than one select device may be used. A single select device may have a $V_H$ about equal to its threshold voltage, $V_{TH}$, (a voltage difference less than the threshold voltage of the memory element) to avoid triggering a reset bit when the select device triggers from a threshold voltage to a lower holding voltage called the snapback voltage. In another example, the threshold current of the memory element may be about equal to the threshold current of the access device even though its snapback voltage is greater than the memory element's reset bit threshold voltage.

One or more MOS or bipolar transistors or one or more diodes (either MOS or bipolar) may be used as the select device. If a diode is used, the bit may be selected by lowering the row line from a higher deselect level. As a further non-limiting example, if an n-channel MOS transistor is used as the select device with its source, for example, at ground, the row line may be raised to select the memory element connected between the drain of the MOS transistor and the column line. When a single MOS or single bipolar transistor is used as the select device, a control voltage level may be used on a "row line" to turn the select device on and off to access the memory element.

Figure 10:
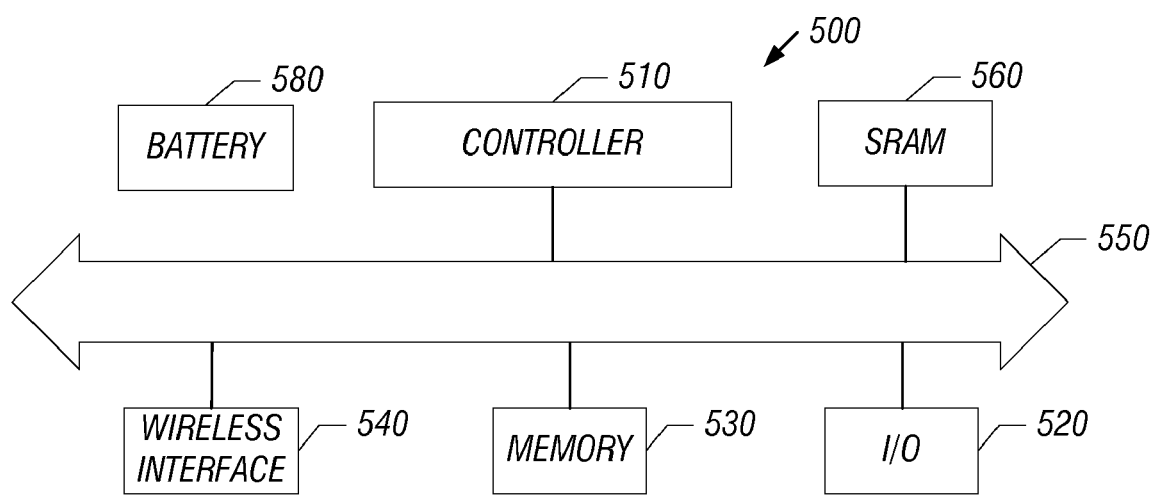
FIG. 10 is a system depiction for one embodiment of the present disclosure.

Turning to FIG. 10, a portion of a system 500 in accordance with an embodiment of the present disclosure is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit or receive information wirelessly. System 500 may be used in any of the following systems: a wireless local area network (WLAN) system, a wireless personal area network (WPAN) system, and a cellular network, although the scope of the present disclosure is not limited in this respect.

System 500 may include a controller 510, an input/output (I/O) device 520 (e.g., a keypad, display), static random access memory (SRAM) 560, a memory 530, and a wireless interface 540 coupled to each other via a bus 550. A battery 580 may be used in some embodiments. It should be noted that the scope of the present disclosure is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory or a memory such as memory discussed herein.

I/O device 520 may be used to generate a message. System 500 may use wireless interface 540 to transmit and receive messages to and from a wireless communication network with a radio frequency (RF) signal. Examples of wireless interface 540 may include an antenna or a wireless transceiver, although the scope of the present disclosure is not limited in this respect.

References throughout this specification to "one embodiment" or "an embodiment" mean that a particular feature, structure, or characteristic described in connection with the embodiment is included in at least one implementation encompassed within the present disclosure. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
    forming a phase change memory cell, the forming including:
        forming a pore in an insulating layer;
        forming a first phase change layer in the pore;
        forming a U-shaped breakdown layer in the pore on the first phase change layer; and
        forming a second phase change layer on the breakdown layer, the first and second phase change layers being separated by the breakdown layer.

2. The method of claim 1 including forming a filament through said breakdown layer.

3. The method of claim 1, further comprising forming an ovonic threshold switch in said pore.

4. The method of claim 3 including forming said ovonic threshold switch before forming the first and second phase change layers.

5. The method of claim 1 including blanket depositing said breakdown layer across a plurality of phase change memory cells.

6. The method of claim 1 wherein said breakdown layer breaks down in response to a voltage of less than 10 volts.

7. The method of claim 1 including depositing chalcogenide material as the first phase change layer in the pore, removing a portion of said chalcogenide material, and thereafter covering a remaining portion of the chalcogenide material with the breakdown layer.

8. The method of claim 1 including forming an upper electrode in the pore after forming the second phase change layer.

9. The method of claim 1 including forming a barrier layer over the insulating layer and over the first and second phase change layers.

10. A phase change memory comprising:
    an insulator layer;
    a pore formed through the insulator layer;
    a first phase change layer in the pore;
    a U-shaped breakdown layer in the pore; and
    a second phase change layer in the pore, said first and second phase change layers sandwiching said breakdown layer.

11. The memory of claim 10 including an ovonic threshold switch formed in said pore.

12. The memory of claim 11 wherein said ovonic threshold switch is formed under said first and second phase change layers.

13. The memory of claim 10 wherein said breakdown layer breaks down in response to an applied voltage difference of less than 10 volts, said breakdown layer being less than 50 Angstroms in thickness.

14. The memory of claim 10 including an upper electrode formed in said pore over said first and second phase change layers.

15. The memory of claim 10 including:
    a barrier layer on said insulator layer and said breakdown layer; and
    a metal layer on said barrier layer.

16. The memory of claim 10 wherein said breakdown layer is a dielectric layer.

17. The memory of claim 10, further comprising a filament formed through said breakdown layer.

18. A system comprising:
    a processor;
    a static random access memory coupled to the processor; and
    a phase change memory coupled to the processor, the phase change memory including:
        an insulator layer;
        a pore formed through the insulator layer;
        a first phase change layer in the pore;
        a U-shaped breakdown layer in the pore; and
        a second phase change layer in the pore, the first and second phase change layers sandwiching the breakdown layer.

19. The system of claim 18 wherein said breakdown layer breaks down in response to an applied voltage difference of less than 10 volts, said breakdown layer being less than 50 Angstroms in thickness.

20. The system of claim 18 including an upper electrode formed in said pore over said first and second phase change layers.

* * * * *